United States Patent
Verronen et al.

(10) Patent No.: US 10,412,857 B2
(45) Date of Patent: Sep. 10, 2019

(54) LIQUID COOLING STATION

(71) Applicant: Adwatec Oy, Kangasala (FI)

(72) Inventors: Arto Verronen, Tampere (FI); Mika Siitonen, Tampere (FI); Jorma Terävä, Tampere (FI)

(73) Assignee: ADWATEC OY, Kangasala (FI)

( * ) Notice: Subject to any disclaimer, the term of this patent is extended or adjusted under 35 U.S.C. 154(b) by 295 days.

(21) Appl. No.: 15/354,107

(22) Filed: Nov. 17, 2016

(65) Prior Publication Data
US 2017/0150646 A1    May 25, 2017

(30) Foreign Application Priority Data
Nov. 19, 2015   (EP) .................................... 15195354

(51) Int. Cl.
| | |
|---|---|
| F28F 7/00 | (2006.01) |
| H05K 7/20 | (2006.01) |
| F04D 13/06 | (2006.01) |
| F28F 9/26 | (2006.01) |
| F28F 23/00 | (2006.01) |
| F04D 29/42 | (2006.01) |
| F04D 13/14 | (2006.01) |

(52) U.S. Cl.
CPC ......... *H05K 7/20272* (2013.01); *F04D 13/06* (2013.01); *F04D 13/14* (2013.01); *F04D 29/4293* (2013.01); *F28F 9/262* (2013.01); *F28F 23/00* (2013.01); *H05K 7/20263* (2013.01); *H05K 7/20927* (2013.01); *F28F 2265/14* (2013.01)

(58) Field of Classification Search
CPC ........... H05K 7/20272; H05K 7/20927; H05K 7/20263; F04D 13/14; F04D 29/4293; F04D 13/06; F28F 23/00; F28F 9/262; F28F 2265/14
USPC ........................................................ 165/80.4
See application file for complete search history.

(56) References Cited

U.S. PATENT DOCUMENTS

| | | | | |
|---|---|---|---|---|
| 2,599,307 | A | * | 6/1952 | Woodson ................ F04D 13/06 |
| | | | | 222/383.2 |
| 2,849,523 | A | * | 8/1958 | Narbut .................... H01F 27/18 |
| | | | | 165/104.25 |
| 2,939,399 | A | * | 6/1960 | Rutschi ................... F04D 13/06 |
| | | | | 310/63 |

(Continued)

FOREIGN PATENT DOCUMENTS

| | | | |
|---|---|---|---|
| WO | WO 2013/076363 A1 | 5/2013 | |
| WO | WO-2013076363 A1 * | 5/2013 | ............. F25D 19/00 |

*Primary Examiner* — Claire E Rojohn, III
(74) *Attorney, Agent, or Firm* — Birch, Stewart, Kolasch & Birch, LLP

(57) ABSTRACT

Liquid cooling station comprises at least one pump and at least one motor connected to the pump for operating the pump to circulate cooling liquid between the cooling station and an object to be cooled, a first cooling liquid outlet port for supplying the cooling liquid towards the object to be cooled and a first cooling liquid inlet port for receiving the cooling liquid from the object to be cooled. The liquid cooling station further comprises at least one connection block, which comprises at least one first cavity for receiving an operating part of the pump, at least one second cavity for an additional operational part, the first cooling liquid inlet and outlet ports and an internal channel system connecting the first cavity to the first cooling liquid inlet and outlet ports.

15 Claims, 3 Drawing Sheets

(56) References Cited

U.S. PATENT DOCUMENTS

| | | | | |
|---|---|---|---|---|
| 3,478,689 A * | 11/1969 | Ball | | F04D 13/06 310/63 |
| 3,969,043 A * | 7/1976 | Bright | | F04D 13/06 417/366 |
| 5,144,531 A * | 9/1992 | Go | | H01L 23/473 165/80.4 |
| 5,148,863 A * | 9/1992 | Fouts | | F28D 1/0333 165/144 |
| 5,522,452 A * | 6/1996 | Mizuno | | H01L 23/427 165/104.33 |
| 6,754,076 B2 * | 6/2004 | Cox | | F04D 13/14 165/80.4 |
| 7,591,302 B1 * | 9/2009 | Lenehan | | H01L 23/34 165/104.33 |
| 7,808,783 B2 * | 10/2010 | Goth | | F25B 49/02 165/80.3 |
| 7,895,854 B2 * | 3/2011 | Bash | | F25B 5/02 62/259.2 |
| 8,464,781 B2 * | 6/2013 | Kenny | | F04B 17/00 165/104.33 |
| 8,526,183 B1 * | 9/2013 | Hamburgen | | H05K 7/20827 165/104.33 |
| 2003/0210991 A1 * | 11/2003 | Struthers | | F04D 9/008 417/305 |
| 2004/0050231 A1 * | 3/2004 | Chu | | H05K 7/2079 83/574 |
| 2005/0200001 A1 * | 9/2005 | Joshi | | F28F 3/08 257/712 |
| 2005/0247433 A1 * | 11/2005 | Corrado | | G06F 1/20 165/80.4 |
| 2007/0256815 A1 * | 11/2007 | Conway | | G06F 1/183 165/80.4 |
| 2009/0159241 A1 * | 6/2009 | Lipp | | F28D 1/05316 165/80.2 |
| 2009/0225513 A1 * | 9/2009 | Correa | | H05K 7/20781 361/700 |
| 2009/0262495 A1 * | 10/2009 | Neudorfer | | G06F 1/20 361/679.47 |
| 2010/0293987 A1 * | 11/2010 | Horst | | F25D 23/00 62/440 |
| 2011/0073292 A1 * | 3/2011 | Datta | | F28F 1/40 165/157 |
| 2012/0210730 A1 * | 8/2012 | Pruett | | F25B 21/02 62/3.2 |
| 2012/0210731 A1 * | 8/2012 | Campbell | | F25B 21/02 62/3.2 |
| 2012/0211204 A1 * | 8/2012 | Agonafer | | H01L 23/473 165/104.31 |
| 2012/0240882 A1 * | 9/2012 | Gao | | B60K 11/02 123/41.55 |
| 2013/0174589 A1 * | 7/2013 | Wightman | | F25B 13/00 62/81 |
| 2013/0213605 A1 * | 8/2013 | Shi | | F28F 9/00 165/96 |
| 2014/0096930 A1 * | 4/2014 | Krug, Jr. | | H05K 7/20781 165/11.1 |
| 2017/0143884 A1 * | 5/2017 | Tanaka | | A61M 1/10 |
| 2017/0191481 A1 * | 7/2017 | Shafer | | F04D 13/06 |
| 2018/0180056 A1 * | 6/2018 | Zolotukhin | | F04D 29/086 |

* cited by examiner

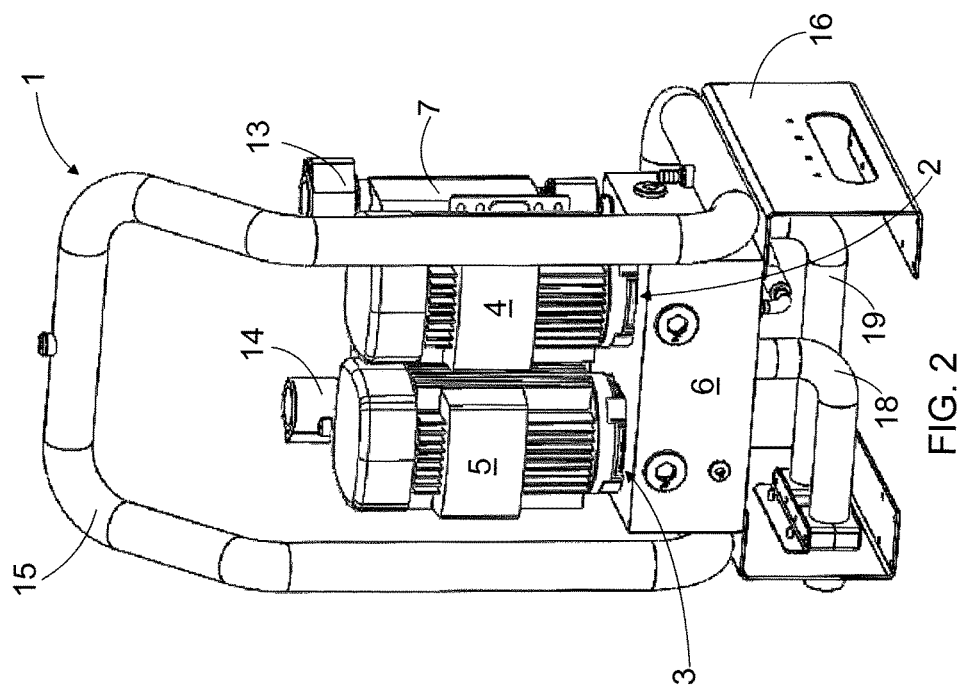
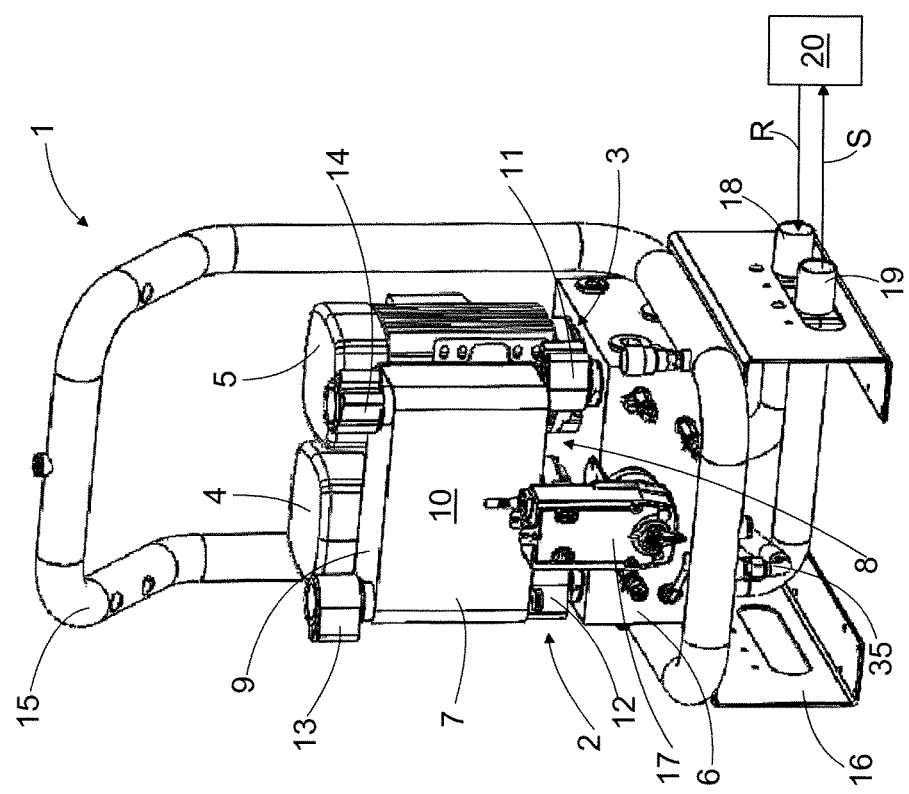

LIQUID COOLING STATION

FIELD OF THE INVENTION

The invention relates to a liquid cooling station.

BACKGROUND OF THE INVENTION

A cooling arrangement or system and a liquid cooling station therein are used to transfer heat away from an object to be cooled, like a power electronic device.

The liquid cooling station comprises a pump and a motor connected thereto for operating the pump to circulate cooling liquid between the cooling station and an object to be cooled. The cooling station also comprises a heat exchanger to transfer the heat away from the cooling liquid flow either to ambient air of the installation site of the liquid cooling station or to separate technical liquid flow intended to receive the heat from the cooling liquid flow. The cooling station receives the cooling liquid flow from the object to be cooled through an inlet channel and supplies the cooling liquid flow towards the object to be cooled through an outlet channel. Furthermore the liquid cooling station may comprise a dedicated frame to which different components of the liquid cooling station are supported to.

A substantially high number of different components in the liquid cooling station and a high number of pipe and hose connections therebetween provide a presence of numerous joints in the liquid cooling station. This, in turn, increases a need for sealing between the different components as well as a risk for leakages of the cooling liquid.

BRIEF DESCRIPTION OF THE INVENTION

An object of the invention is to provide a novel liquid cooling station.

The liquid cooling station is characterized by the features of the independent claim.

The liquid cooling station comprises at least one pump and at least one motor connected to the at least one pump for operating the at least one pump to circulate cooling liquid between the cooling station and an object to be cooled, at least one first cooling liquid outlet port for supplying the cooling liquid towards the object to be cooled and at least one first cooling liquid inlet port for receiving the cooling liquid from the object to be cooled. Furthermore the liquid cooling station comprises at least one connection block, which connection block comprises at least one first cavity arranged to receive an operating part of the at least one pump, at least one second cavity for an additional operational part, the at least one first cooling liquid outlet port and the at least one first cooling liquid inlet port, and an internal channel system arranged to connect the at least one first cavity to the at least one first cooling liquid outlet port and the at least one first cooling liquid inlet port.

The connection block provides a compact element for connecting the parts of the cooling station, like the pumps, the motors and the heat exchanger together, whereby all the pipes or hoses used earlier to connect those parts together in the cooling station may be left out. This also provides that a number of connections are reduced too. As a consequence of that risks for cooling liquid leakages are reduced.

Some embodiments of the invention are disclosed in dependent claims.

BRIEF DESCRIPTION OF THE DRAWINGS

In the following the invention will be described in greater detail by means of preferred embodiments with reference to the accompanying drawings, in which FIG. 1 shows schematically an oblique front view of a liquid cooling station;

FIG. 2 shows schematically an oblique back view of the liquid cooling station of FIG. 1;

For the sake of clarity, the figures show some embodiments of the invention in a simplified manner. Like reference numerals identify like elements in the figures.

DETAILED DESCRIPTION OF THE INVENTION

Figure 3:
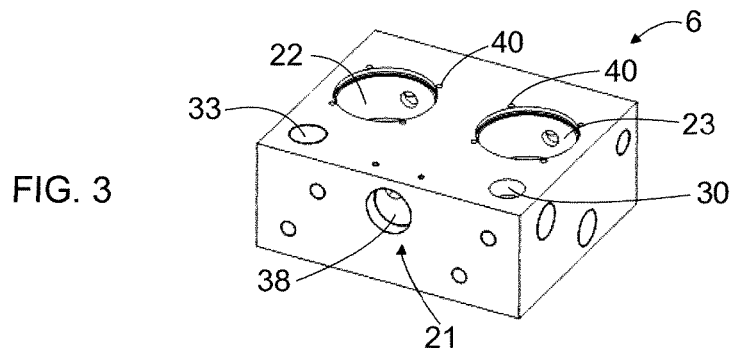
FIG. 3 discloses schematically an oblique front view of a connection block.

FIG. 1 is a schematic oblique front view of a liquid cooling station 1 and FIG. 2 is a schematic oblique back view of the liquid cooling station 1 of FIG. 1. Later the liquid cooling station 1 may also be called the cooling station 1. The cooling station 1 of FIGS. 1 and 2 comprises a first pump 2 and a first motor 4 connected to the first pump 2 for operating the first pump 2 to circulate a cooling liquid between the cooling station 1 and an object 20 to be cooled. In the object 20 to be cooled an excessive heat in the object 20 is transferred to a cooling liquid flow and by the cooling liquid flow out of the object 20 to be cooled.

The cooling station 1 comprises also a second pump 3 and a second motor 5 connected to the second pump 3 for operating the second pump 3 to also circulate the cooling liquid between the cooling station 1 and the object 20 to be cooled. In the embodiment of FIGS. 1 and 2 the first motor 4 and the second motor 5 are electric motors, but, depending on a site or equipment where the cooling station 1 is intended to be applied, the motors could also be pressure medium operated motors. Typical applications for the liquid cooling station 1 are for example cooling power electronics devices or installations, such as reactive power compensators, power drives in ships and trains, computer systems in data processing centres, or cooling systems in industrial processes.

The first pump 2 and the first motor 4 connected thereto, as well as the second pump 3 and the second motor 5 connected thereto, are supported to a connection block 6. FIG. 3 discloses schematically an oblique front view of an embodiment of the connection block 6. The structure, use and operation of the connection block 6 are disclosed in more detail later.

The cooling station 1 of FIGS. 1 and 2 comprises further a heat exchanger 7, through which at least part of the cooling liquid flow returning from the object 20 to be cooled back to the cooling station 1 is arranged to flow. The heat exchanger 7 comprises a bottom part 8, a top 9 and a casing 10. Inside the heat exchanger 7 there are a number of internal heat exchanger elements for transferring heat energy from the cooling liquid flow returning from the object 20 to be cooled to a technical liquid flow and by the technical liquid flow out of the cooling station 1. The heat exchanger 7 is thus a liquid to liquid heat exchanger. A general structure and operating principle of different liquid to liquid heat exchangers are known for a person skilled in the art and therefore they are not disclosed in more detail herein.

The heat exchanger 7 comprises at the bottom part 8 thereof a cooling liquid inlet port 11 of the heat exchanger 7 for the cooling liquid flow to enter into the heat exchanger 7 and a cooling liquid outlet port 12 of the heat exchanger 7 for the cooling liquid flow to discharge out of the heat exchanger 7. The heat exchanger 7 comprises also at the top part 9 thereof a technical liquid inlet port 13 of the heat exchanger 7 for the technical liquid flow to enter into the heat exchanger 7 and a technical liquid outlet port 14 of the heat exchanger 7 for the technical liquid flow to discharge out of the heat exchanger 7.

The cooling liquid may be for example water, de-ionized water or water-alcohol mixture, such as water-glycol or water-ethanol mixture, salt water, liquid salt, oil or other heat transfer fluid. The technical liquid may also be water, such as water taken from a lake or a sea or other water supply.

The cooling station 1 comprises also a frame 15 to which the connection block 6 is supported to. The pumps 2, 3 may be supported to the connection block 6 with fastening elements, like bolts, inserted through fastening openings 40, shown schematically in FIGS. 3, 4, 5. The frame 15 in the embodiment of FIGS. 1 and 2 may be made of a single bent tubular pipe section or a number of interconnected pipe sections so as to form an endless and hollow tubular structure. An inner volume of the tubular structure of the frame 15 may be arranged to provide an expansion tank for the cooling liquid so as to compensate changes in the volume of the cooling liquid, the changes in the volume of the cooling liquid originating from temperature variations of the cooling liquid. The appearance of the frame 15 of the cooling station 1 may vary from that shown in the FIGS. 1 and 2.

In the embodiment of FIGS. 1 and 2 the frame 15 is seated to a base 16 through which the cooling station 1 may be installed to an installation site of the cooling station 1. Other ways to install the cooling station 1 may, however, be used.

FIG. 1 discloses also an actuator 17 configured to control an operation of a control valve 32 described in more detail later. An operation of the actuator 17 is controlled by an external control system which may also be configured to control operations of the pumps 2, 3 and the motors 4, 5 connected thereto. In that case the external control system may comprise a frequency converter for controlling rotation speeds of the motors. The external control system may be configured to receive measurement information from a number of sensors or transducers possibly installed in the cooling station 1 or in the system connected thereto. Different examples of embodiments like that are disclosed later.

FIGS. 1 and 2 disclose also an inlet channel 18 through which the cooling station 1 receives the cooling liquid flow from the object 20 to be cooled, as shown schematically in FIG. 1 with an arrow indicated by reference sign R. Furthermore FIGS. 1 and 2 disclose an outlet channel 19 through which the cooling station 1 supplies the cooling liquid to the object 20 to be cooled, as shown schematically in FIG. 1 with an arrow indicated by reference sign S.

Figure 4:
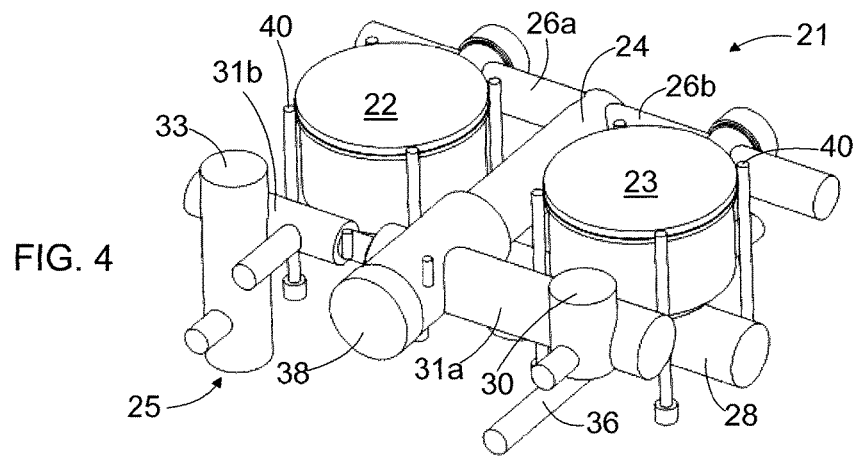
FIG. 4 discloses schematically a diagonal front view of an internal channel system of the connection block of FIG. 3.
Figure 5:
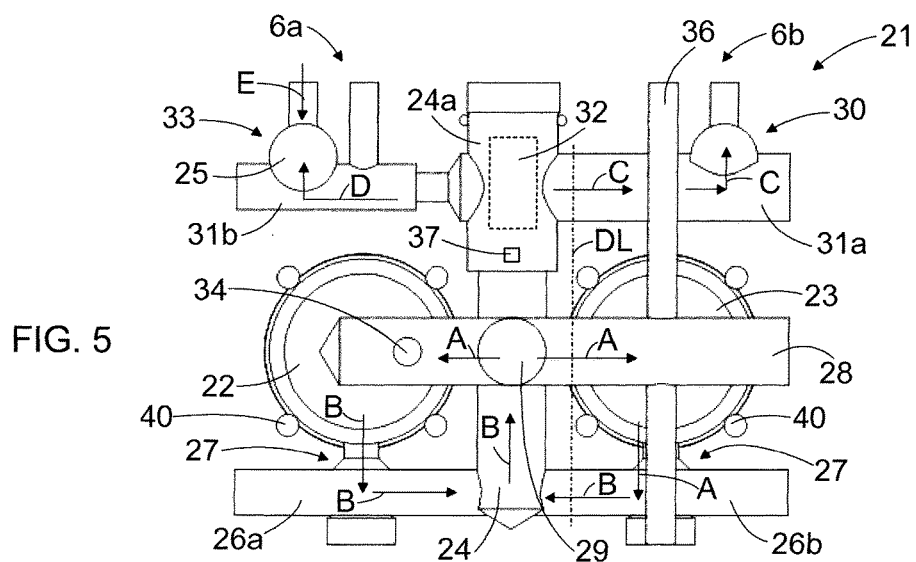
FIG. 5 discloses schematically the internal channel system of FIG. 4 from below.

FIG. 3 discloses schematically an oblique front view of the connection block 6, FIG. 4 discloses schematically an oblique front view of an internal channel system 21 of the connection block 6 of FIG. 3 and FIG. 5 discloses schematically the internal channel system 21 of FIG. 4 from below. FIGS. 4 and 5 are thus kind of inverted or reversed views of the internal structure of the connection block 6 of FIG. 3, whereby the internal channels of the connection block are viewed as pipes.

The connection block 6 comprises a first cavity 22 that is intended to receive an operating part, such as an impeller, of the first pump 2, or in other words, the operating part of the first pump 2 is embedded into the first cavity 22 of the connection block 6. The connection block 6 comprises further a second cavity 23 that is intended to receive, i.e. arranged to receive or configured to receive, an operating part, such as an impeller, of the second pump 3, or in other words, the operating part of the second pump 3 is embedded into the second cavity 23 of the connection block 6.

The internal channel system 21 of the connection block 6 comprises a supply channel 24 to supply the cooling liquid towards a first cooling liquid outlet port 25 to supply the cooling liquid from the cooling station 1 towards the object 20 to be cooled. The first cooling liquid outlet port 25 is connected to the outlet channel 19 of the cooling station 1.

The supply channel 24 is connected through a first connection channel 26a to the internal volume of the first cavity 22. The supply channel 24 is also connected to the internal volume of the second cavity 23 through a second connection channel 26b. Between the first connection channel 26a and the first cavity 22, as well as between the second connection channel 26b and the second cavity 23, there are one-way valves 27, that prevent the cooling liquid flow to enter from one cavity to the other through the first 26a and second 26b connection channels in a case that only one pump is operated at a time.

The internal channel system 21 comprises also a suction channel 28 and a first cooling liquid inlet port 29 therein for receiving the cooling liquid flow from the object 20 to be cooled. The first cooling liquid inlet port 29 is connected to the inlet channel 18 of the cooling station 1. The suction channel 28 is open to both cavities 22, 23, whereby the return flow of the cooling liquid flow from the object 20 to be cooled back to the cooling station 1 may enter into the cavities 22, 23 by the suction effect provided by the operation of the pumps 2, 3.

The internal channel system 21 comprises also a third connection channel 31a which connects the supply channel 24 to a second cooling liquid outlet port 30 that is to be connected to the first cooling liquid inlet port 11 of the heat exchanger 7 for supplying at least part of the cooling liquid flow from the connection block 6 to the heat exchanger 7. To be more precise, the third connection channel 31a is connected to an extension portion 24a of the supply channel 24.

The internal channel system 21 comprises also a fourth connection channel 31b which connects the supply channel 24 to a first cooling liquid outlet port 25 for supplying at least part of the cooling liquid flow straight from the supply channel 24 to the first cooling liquid outlet port 25, i.e. to the outlet channel 19 of the cooling station 1, i.e. straight towards the object 20 to be cooled without circulating through the heat exchanger 7. To be more precise, the fourth connection channel 31b is connected to an extension portion 24a of the supply channel 24.

The extension portion 24a of the supply channel determines a space or a volume wherein the control valve 32 may be seated. The position of the control valve 32 determines which portion of the cooling liquid flow flows straight towards the first cooling liquid outlet port 25 through the fourth connection channel 31b and which portion of the cooling liquid flow flows to the heat exchanger 7 through the third connection channel 31a. The control valve 32 is shown in FIG. 4 very schematically by a box drawn with a broken line.

The internal channel system 21 comprises also a second cooling liquid inlet port 33 that is to be connected to the first cooling liquid outlet port 12 of the heat exchanger 7 for receiving the cooling liquid flow circulated through the heat exchanger 7 back to the connection block 6. The second cooling liquid inlet port 33 is connected to the first cooling liquid outlet port 25 for supplying the cooling liquid flow returned from the heat exchanger 7 to the outlet channel 19 of the cooling station 1 and towards the object 20 to be cooled.

The operation of the cooling station 1 and the flow of the cooling liquid in the connection block 6 take place as follows. This flow of the cooling liquid from the cooling station 1 to the object 20 to be cooled and from the object 20 to be cooled back to the cooling station 1 is provided by a pressure provided by the operation, i.e. rotation, of the operating parts of the pumps 2, 3 in the cavities 22, 23.

The cooling liquid flows from the object 20 to be cooled back to the cooling station 1 and to the connection block 6 therein through the inlet channel 18 and the first cooling liquid inlet port 29 into the suction channel 28. From the suction channel 28 the cooling liquid flows into the first 22 and the second 23 cavities. This is disclosed schematically with arrows indicated by a reference sign A in FIG. 5.

From the cavities 22, 23 the cooling liquid is supplied to the supply channel 24 through the first 26a and the second 26b connection channels, and through the supply channel 24 towards the extension portion 24a and the control valve 32 therein, as disclosed schematically with arrows indicated by a reference sign B in FIG. 5. Depending on the circumstances, and especially the temperature of the cooling liquid flow returning from the object 20 to be cooled, at least part of the cooling liquid flow flowing through the supply channel 24 may be directed by the control valve 32 towards the heat exchanger 7 through the third connection channel 31a and the second cooling liquid outlet port 30, as disclosed schematically with arrows indicated by a reference sign C in FIG. 5. The rest of the cooling liquid flow, if any, may be supplied directly out of the first cooling liquid outlet port 25 towards the object 20 to be cooled, as disclosed schematically with an arrow indicated by a reference sign D in FIG. 5.

In the heat exchanger 7 the excessive heat of the cooling liquid flow that has returned from the object 20 to be cooled, is transferred from the cooling liquid flow to the technical liquid flow. The cooling liquid circulated through the heat exchanger 7 returns from the heat exchanger 7 back to the connection block 6 through the second cooling liquid inlet port 33. From the second cooling liquid inlet port 33 the cooling liquid circulated through the heat exchanger 7 flows straight to the first cooling liquid outlet port 25, as disclosed schematically with an arrow indicated by a reference sign E in FIG. 5, whereby it mixes with the cooling liquid flow portion not circulating through the heat exchanger 7.

The connection block 6 provides a compact solution for connecting the parts of the cooling station 1, i.e. the pumps 2, 3, the motors 4, 5 and the heat exchanger 7 together, and makes it possible to totally leave out all the pipes or hoses used earlier to connect those parts of the cooling station 1 together. This also provides that a number of connections are reduced too. As a consequence of that risks for cooling liquid leakages are reduced.

The internal channel system 21 disclosed in FIG. 5 comprises also a tank port, such as a port 34 shown in the suction channel 28, through which tank port 34 the internal channel system 21 may be connected to a cooling liquid tank, i.e. an expansion tank, of the cooling station 1. In the embodiment disclosed above the expansion tank of the cooling station 1 is provided by the internal volume of the frame 15, to which the tank port 34 may be connected with a pipe 35 shown schematically in FIG. 1. Through the tank port 34 portion of the cooling liquid may flow into the tank when the volume of the cooling liquid expands excessively due to a thermal expansion of the cooling liquid caused by the excessive heat received by the cooling liquid in the object 20 to be cooled.

The internal channel system 21 disclosed in FIGS. 4 and 5 comprises also a tank channel 36, which may be connected to the cooling liquid tank of the cooling station 1. Through the tank channel 36 more cooling liquid may be supplied from the cooling liquid tank to the cooling system. The tank channel 36 may open to one of the cavities 22, 23, for example. In the embodiment of the connection block 6 disclosed above the tank channel 36 is arranged to open to the second cavity 23.

FIGS. 3, 4 and 5 disclose some ports or borings that are not referred to with any reference sign. These ports or borings either form as a result of manufacturing of the channels of the internal channel system 21 of the connection block 6 or provide an entrance for sensors or transducers possibly installed inside the connection block 6.

According to an embodiment, as already shortly referred to above, at least a portion of the cooling liquid flow flowing in the supply channel 24 may be directed straight out of the connection block 6 through the first cooling liquid outlet port 25 and the rest of the cooling liquid flow flowing in the supply channel 24 may be directed through the third connection channel 31a and the second cooling liquid outlet port 30 to the heat exchanger 7. The mutual proportion of the aforementioned cooling liquid flow portions is determined with the position of the control valve 32 depending for example on a prevailing cooling power requirement. If the prevailing required cooling power is unsubstantial, all the cooling liquid flow flowing in the supply channel 24 may be directed straight out of the connection block 6 through the first cooling liquid outlet port 25. If the prevailing required cooling power is very high, all the cooling liquid flow flowing in the supply channel 24 may be directed to flow through the heat exchanger 7.

The position of the control valve 32 may be adjusted by the actuator 17. The position of the control valve 32 may be adjusted for example on the basis of the temperature difference between a temperature of the cooling liquid flow returning from the object 20 to be cooled and a temperature of the technical liquid flow flowing into the heat exchanger 7. Alternatively the position of the control valve 32 may be adjusted only on the basis of the temperature of the cooling liquid flow flowing to the object 20 to be cooled, for example if it is assumed that the temperature of the technical liquid flow flowing into the heat exchanger 7 is substantially constant.

The temperature of the cooling liquid flow returning from the object 20 to be cooled may be measured with a temperature sensor 37 that may be located for example in the first cooling liquid outlet port 25 of the connection block 6, as schematically disclosed in FIG. 5. A possible wiring for the temperature sensor 37 is not disclosed in FIG. 5 for the sake of clarity. The temperature of the technical liquid flow may be measured with a temperature sensor located for example somewhere in the piping for the technical liquid flow. The external control system may determine a correct position for the control valve 32 on the basis of the at least one said temperature measurement above and control the operation of the actuator accordingly. The actuator 17 is arranged in connection with the control valve 32 through a port indicated by reference sign 38. Because the flow volumes or the flow rates of the cooling liquid flow and the technical liquid flow are typically substantially constant and known from the cooling system design parameters, there is no unconditional necessity to measure the flow volumes or the flow rates of the cooling liquid flow and the technical liquid flow.

However, if it is necessary to determine the flow volumes or the flow rates of the cooling liquid flow and the technical liquid flow, the flow volume or the flow rate of the cooling liquid may be determined with a flow transmitter arranged in the supply channel 24 of the connection block 6, and the flow volume or the flow rate of the technical liquid may be determined with a flow transmitter arranged in the piping for the technical liquid flow.

In the embodiment shown in the Figures above, the cooling station 1 comprises two pumps 2, 3 and respective cavities 22, 23 in the connection block 6. The cavities 22, 23 and the pumps 2, 3 therein are arranged parallel to each other and are operated at the same time. However, only one pump at a time may be operated and the other pump may be in reserve. In that case the second pump 3 at least partly embedded into the second cavity 23 may be considered to provide an additional operational part for the cooling station 1.

In the embodiment shown in the Figures above the cavities 22, 23 and the pumps 2, 3 therein are provided with common cooling liquid inlet 29 and outlet 25 ports but totally separate channel system for each cavity 22, 23 and the respective pump 2, 3 may be applied, whereby the connection block 6 may comprise several inlet 29 and outlet 25 ports, for example.

According to an embodiment, the cooling station 1 may, however, comprise only one pump, i.e. only the first pump 2 the operating part of which is embedded into the first cavity 22 in the connection block 6. In that embodiment the second cavity 23 may be reserved for an expansion tank for the cooling liquid, i.e. the second cavity 23 may be arranged to receive or configured to receive the expansion tank for the cooling liquid, whereby this expansion tank for the cooling liquid would be at least partly embedded into the second cavity 23. The expansion tank being at least partly embedded into the second cavity 23 may be considered to provide an additional operational part for the cooling station 1.

According to an embodiment, an additional heating or cooling element may be at least partly embedded into the second cavity 23, i.e. the second cavity 23 may be arranged to receive or configured to receive the additional heating or cooling element, whereby this additional heating or cooling element may be considered to provide an additional operational part for the cooling station 1.

According to an embodiment, the cooling station 1 may comprise, depending for example on an application it is intended to, more than two pumps and corresponding number of cavities in the connection block where the operating parts of the pumps are embedded into. Output capacities of the pumps may differ from each other. In this embodiment, too, only some of the pumps available may be operated at a time for adjusting the output and/or the pressure of the cooling liquid flow, depending for example on the cooling liquid flow volume or flow rate required for cooling the object 20 to be cooled. In this embodiment the motors operating the pumps may be for example on/off-operated, whereby any frequency converters are not necessarily needed for controlling the operation of the motors.

In the embodiment shown in the Figures above, the pumps 2, 3 and the respective cavities 22, 23 in the connection block 6 are arranged in parallel respective to each other. Alternatively two or more pumps and the respective cavities could be in series relative to each other. In that case the output of the cooling liquid flow will be substantially constant but each pump will increase the pressure of the cooling liquid flow, whereby the ratio of the pressure and the output of the cooling liquid flow may be adjusted by changing a number of the pumps operating at a time.

Figure 6:
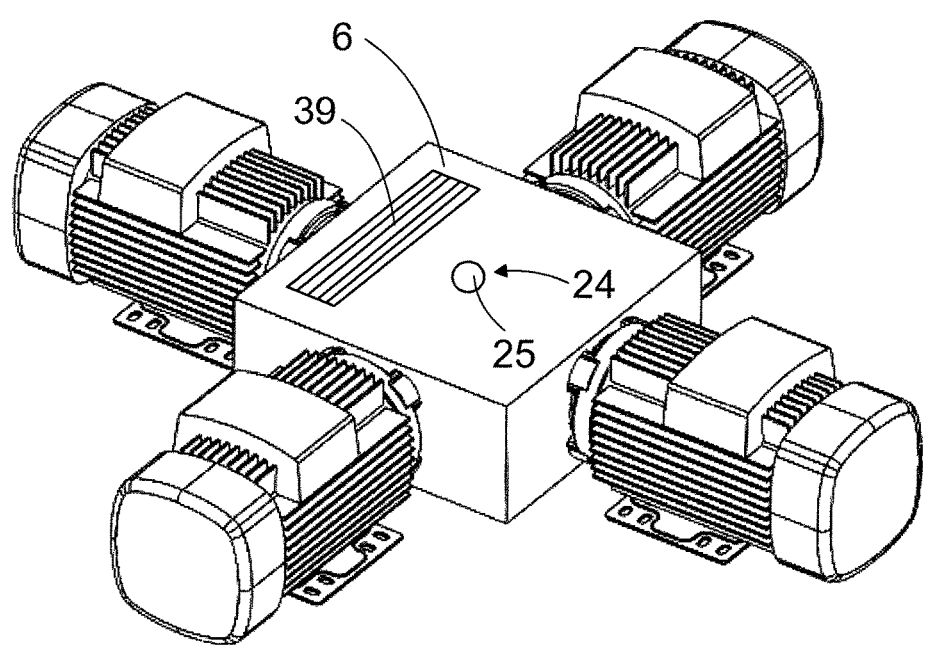
FIG. 6 discloses schematically an oblique view of a part of another liquid cooling station.

According to an embodiment, the pumps and the respective cavities are arranged in opposed positions relative to each other. An example of that kind of arrangement is disclosed schematically in FIG. 6. In FIG. 6, the cooling station 1 comprises altogether four pumps and respective motors and respective cavities in the connection block 6. Two pumps in pairs and respective motors and respective cavities are arranged in opposed positions relative to the connection block. The cooling liquid is supplied out of the connection block from a supply channel (not shown in FIG. 6) arranged in the centre of the connection block.

According to an embodiment, the connection block 6 may be formed of two or more interconnected block parts. FIG. 5 discloses schematically a division line DL, shown with a dot-and-dash line, along which the connection block 6 shown in FIGS. 3, 4 and 5 could be divided into two connection block parts 6a, 6b. The first connection block part 6a is arranged to comprise at least the first cavity 22, the first cooling liquid outlet port 25 and the at least one first cooling liquid inlet port 29. The division of the connection block 6 into connection block parts may be helpful in view of the manufacturing of the connection block, i.e. the internal channel system 21 of the connection block 6 may be easier to manufacture. When considering the sealing of the joints between the connection block parts, the sealing of the joints between the connection block parts can still be made so reliable that any risks of leakages of the cooling liquid are still lower than in prior art cooling stations comprising a high number of different pipes and/or hoses connection to the parts of the cooling station together.

According to an embodiment of the cooling station 1, the heat exchanger 7 may be at least partly integrated with the connection block 6. According to an embodiment like that, an upper surface of the connection block is processed to provide a bottom part of the heat exchanger 7. In that case the second cooling liquid outlet port of the connection block for supplying the cooling liquid flow towards the heat exchanger as well as the second cooling liquid inlet port of the connection block for receiving the cooling liquid flow from the heat exchanger may be connected straight to corresponding heat exchanger elements inside the heat exchanger 7.

According to an embodiment of the cooling station 1, the heat exchanger 7 may be totally integrated with the connection block 6 so that the connection block 6 comprises also the heat exchanger 7. In this case the connection block 6 comprises internal heat exchanger elements for transferring heat from the cooling liquid flow to the technical liquid. In this embodiment the connection block does not comprise any separate second cooling liquid inlet port or any separate second cooling liquid outlet port. This kind of embodiment of the connection block may be manufactured for example by 3D-printing.

According to an embodiment of the cooling station 1, the liquid to liquid heat exchanger 7 may be replaced, at least in applications requiring low cooling power, with a heatsink 39 provided at least at part of an outer surface of the connection block 6. In that case the heatsink 39 provides a heat exchanger transferring heat from the cooling liquid flow to an ambient air. The heatsink 39 may be formed to the outer surface of the connection block either by machining the outer surface of the connection block 39 to provide the heatsink 39 or by bonding an originally separate heatsink 39 to the outer surface of the connection block 6. The heatsink 39 is shown schematically in schematically in FIG. 6. The cooling station 1 comprising the heatsink 39 in the connection block 6 may still also comprise a liquid to liquid heat exchanger which is either internal or external to the connection block 6. According to an embodiment, the cooling station 1 does not comprise any heat exchanger. In that case the heat exchanger may be located outside the cooling station and at least part of the cooling liquid flow returning from the object 20 to be cooled is circulated through the heat exchanger via a piping external to the cooling station 1. In this case the heat exchanger 1 may also be a liquid to air heat exchanger because the space reserved for the heat exchanger may be much larger outside the cooling station 1 than inside the cooling station 1.

It will be obvious to a person skilled in the art that, as the technology advances, the inventive concept can be implemented in various ways. The invention and its embodiments are not limited to the examples described above but may vary within the scope of the claims.

The invention claimed is:

1. A liquid cooling station comprising:
   at least one pump and at least one motor connected to the at least one pump for operating the at least one pump to circulate cooling liquid between the liquid cooling station and an object to be cooled,
   at least one first cooling liquid outlet port for supplying the cooling liquid towards the object to be cooled,
   at least one first cooling liquid inlet port for receiving the cooling liquid from the object to be cooled, and
   at least one connection block, which connection block comprises:
      at least one first cavity arranged to receive an operating part of the at least one pump,
      at least one second cavity for an additional operational part,
      the at least one first cooling liquid outlet port and the at least one first cooling liquid inlet port, and
      an internal channel system arranged to connect the at least one first cavity to the at least one first cooling liquid outlet port and the at least one first cooling liquid inlet port.

2. The liquid cooling station as claimed in claim 1, wherein the at least one second cavity is arranged to receive an operating part of the at least one another pump, and
   the internal channel system of the connection block is arranged to connect the at least one second cavity to the at least one first cooling liquid outlet port and the at least one first cooling liquid inlet port.

3. The liquid cooling station as claimed in claim 1, wherein the at least one second cavity is arranged to receive an expansion tank for the cooling liquid.

4. The liquid cooling station as claimed in claim 1, wherein the connection block further comprises
   at least one second cooling liquid outlet port for supplying the cooling liquid to at least one heat exchanger, and
   at least one second cooling liquid inlet port for receiving the cooling liquid from the at least one heat exchanger, and
   wherein the at least one second cooling liquid inlet port is interconnected with the at least one first cooling liquid outlet port.

5. The liquid cooling station as claimed in claim 4, wherein the liquid cooling station comprises a control valve embedded into the connection block to control a division of a flow of the cooling liquid between the at least one first cooling liquid outlet port and the at least one second cooling liquid outlet port.

6. The liquid cooling station as claimed in claim 1, wherein the connection block is formed of at least two interconnected connection block parts, wherein at least one connection block part comprises at least the at least one first cavity, the at least one first cooling liquid outlet port and the at least one first cooling liquid inlet port.

7. The liquid cooling station as claimed in claim 1, wherein the at least one first cavity and the at least one second cavity are arranged in parallel positions relative to each other and wherein the internal channel system of the connection block is arranged to connect the at least one first cavity and the at least one second cavity to the same first cooling liquid outlet port and the same first cooling liquid inlet port.

8. The liquid cooling station as claimed in claim 1, wherein the at least one first cavity and the at least one second cavity are arranged in series relative to each other.

9. The liquid cooling station as claimed in claim 1, wherein the liquid cooling station comprises at least two pumps and a number of the pumps to be operated at a time is varied for adjusting output and/or pressure of the cooling liquid flow.

10. The liquid cooling station as claimed in claim 1, wherein the liquid cooling station comprises a heat exchanger.

11. The liquid cooling station as claimed in claim 10, wherein at least part of the heat exchanger is integrated with the connection block.

12. The liquid cooling station as claimed claim 1, wherein an outer surface of the connection block comprises a heatsink.

13. The liquid cooling station as claimed in claim 12, wherein the heatsink is formed to the outer surface of the connection block by machining the outer surface of the connection block or by bonding an originally separate heatsink to the outer surface of the connection block.

14. The liquid cooling station as claimed in claim 1, wherein the liquid cooling station comprises a frame against which the connection block is supported to, an inner volume of the frame being arranged to provide an expansion tank for the cooling liquid.

15. The liquid cooling station as claimed in claim 14, wherein the frame is an endless and hollow tubular structure.

* * * * *